(12) United States Patent
Ishibashi

(10) Patent No.: US 11,776,817 B2
(45) Date of Patent: Oct. 3, 2023

(54) PATTERN FORMING METHOD

(71) Applicant: TOKYO ELECTRON LIMITED, Tokyo (JP)

(72) Inventor: Shota Ishibashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 17/396,380

(22) Filed: Aug. 6, 2021

(65) Prior Publication Data
US 2022/0051900 A1 Feb. 17, 2022

(30) Foreign Application Priority Data

Aug. 11, 2020 (JP) ................................. 2020-135889

(51) Int. Cl.
| | | |
|---|---|---|
| *H01L 21/308* | (2006.01) | |
| *H01L 21/02* | (2006.01) | |
| *H01L 21/321* | (2006.01) | |
| *H01L 21/306* | (2006.01) | |

(52) U.S. Cl.
CPC .... *H01L 21/3086* (2013.01); *H01L 21/02266* (2013.01); *H01L 21/30608* (2013.01); *H01L 21/3212* (2013.01)

(58) Field of Classification Search
CPC ........... H01L 21/3086; H01L 21/02266; H01L 21/30608; H01L 21/3212; H01L 21/0337; H01L 21/0334; H01L 21/762; H01L 21/76224

USPC ....................................................... 438/694
See application file for complete search history.

(56) References Cited

U.S. PATENT DOCUMENTS

| | | | |
|---|---|---|---|
| 8,956,962 B2 * | 2/2015 | Lee .................... | H01L 21/0337 438/551 |
| 9,941,164 B1 * | 4/2018 | Kim .................. | H01L 21/76897 |
| 2020/0328082 A1 * | 10/2020 | Ko .................... | H01L 29/66795 |

FOREIGN PATENT DOCUMENTS

| | | | | |
|---|---|---|---|---|
| JP | H11-214651 A | | 8/1999 | |
| JP | 2020026575 A | * | 2/2020 | ............. C23C 14/34 |

* cited by examiner

*Primary Examiner* — Duy Vu N Deo
(74) *Attorney, Agent, or Firm* — Fenwick & West LLP

(57) ABSTRACT

There is provided a pattern forming method for forming a pattern on a substrate. The method comprises preparing on a base a substrate in which a plurality of core materials arranged in a convex shape and in a line shape, and first and second line materials arranged in a convex shape and in a line shape on one side and the other side of each of the core materials, respectively, are formed, selectively forming a mask material on any one of the first and the second line materials by a process including anisotropic film formation, by a process including etching using a line mask having a line-shaped hole at a portion corresponding to a region where line cutting is performed, etching and removing the one on which the mask material is not formed among the first and the second line materials in the region, and removing the core material.

17 Claims, 16 Drawing Sheets

PATTERN FORMING METHOD

CROSS-REFERENCE TO RELATED APPLICATIONS

This application claims priority to Japanese Patent Application No. 2020-135889, filed on Aug. 11, 2020, the entire contents of which are incorporated herein by reference.

TECHNICAL FIELD

The present disclosure relates to a pattern forming method.

BACKGROUND

In manufacturing semiconductor devices, there is known a technique referred to as "shallow trench isolation (STI)" for performing device isolation by forming a fine trench on a silicon substrate and embedding an insulator in the trench (see, e.g., Japanese Patent Application Publication No. H11-214651). In the case of forming an STI groove, conventionally, a substrate having on a surface thereof a line pattern in which multiple fine convex line materials are formed is prepared. Then, the line material is cut to form a desired fine pattern, and the pattern is transferred to form an STI groove on the substrate.

SUMMARY

The present disclosure provides a pattern forming method capable of forming a desired pattern by performing line cutting of a line material with high accuracy without complicating the process involved.

In accordance with an aspect of the present disclosure, there is provided a pattern forming method for forming a pattern on a substrate. The method comprises preparing a substrate on a base of which a plurality of core materials arranged in a convex shape and in a line shape, and first and second line materials arranged in a convex shape and in a line shape on one side and the other side of each of the core materials, respectively, are formed, selectively forming a mask material on any one of the first line material and the second line material by a process including anisotropic film formation, by a process including etching using a line mask having a line-shaped hole at a portion corresponding to a region where line cutting is performed, etching and removing the one on which the mask material is not formed among the first line material and the second line material in the region, and removing the core material.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described with reference to the accompanying drawings.

Herein, as a pattern forming method according to one embodiment, a method of forming an STI groove forming pattern will be described as an example.

Figure 1:
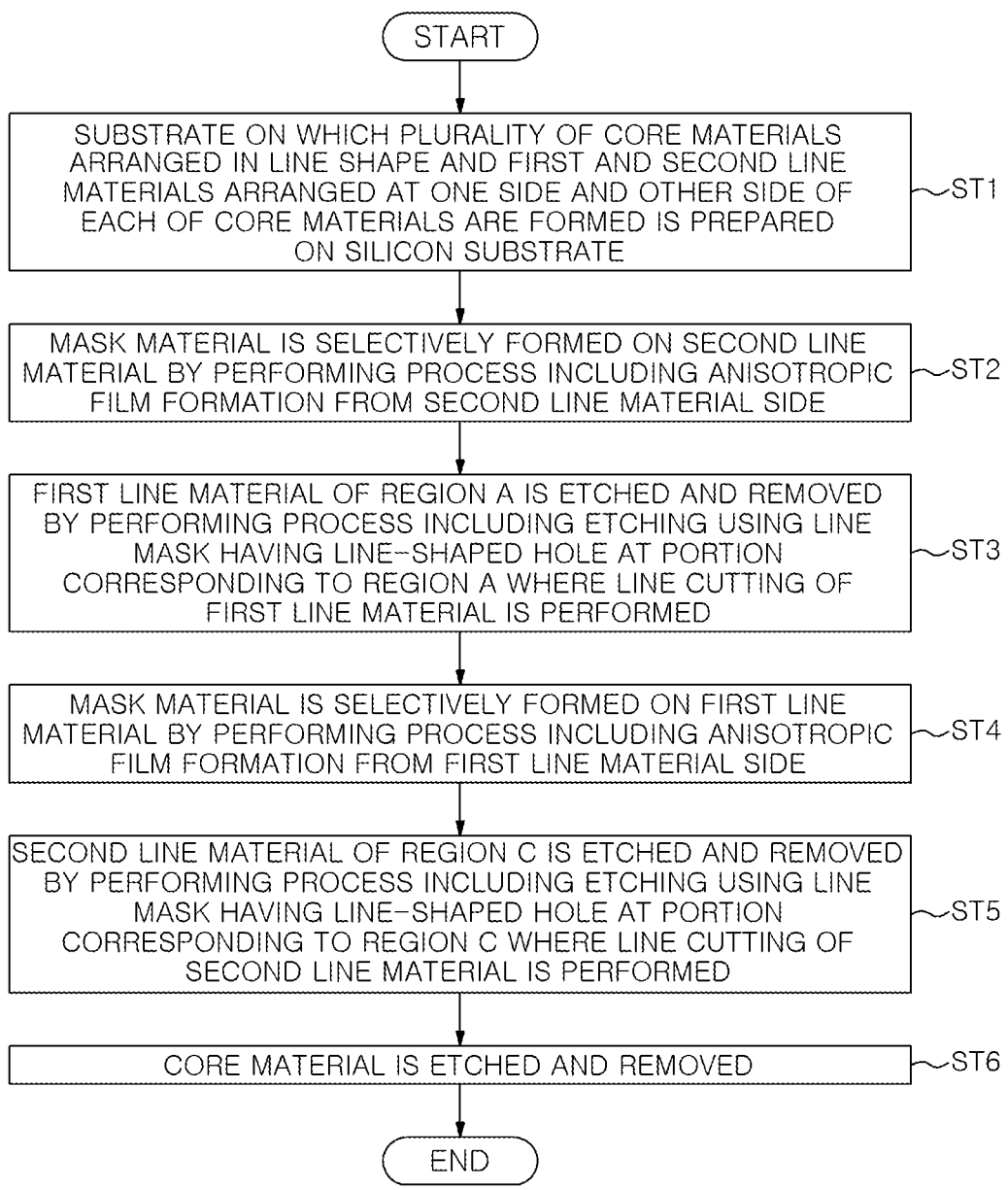
FIG. 1 is a flowchart showing a pattern forming method according to one embodiment.

FIG. 1 is a flowchart showing a pattern forming method according to one embodiment. In the pattern forming method of the present embodiment, first, a substrate W shown in a cross-sectional view of FIG. 2 and a plan view of FIG. 3, for example, is prepared (step STI).

Figure 2:
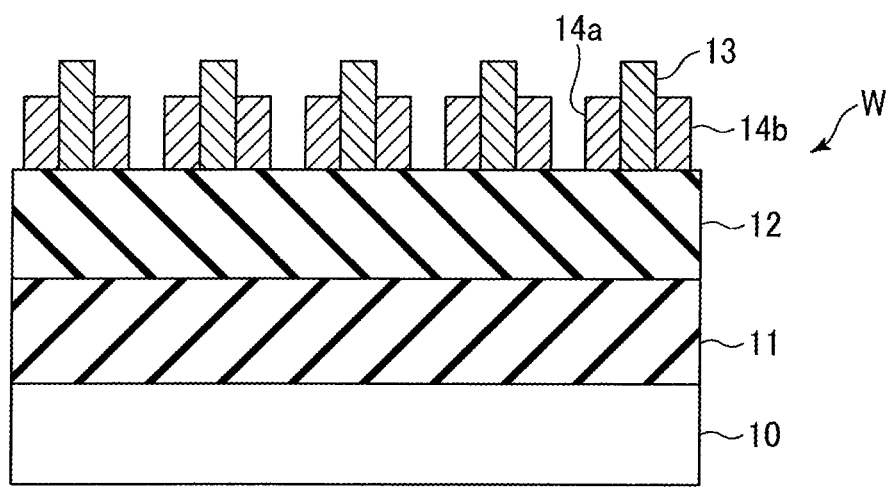
FIG. 2 is a cross-sectional view showing a structure of a substrate used in the pattern forming method according to the embodiment.
Figure 3:
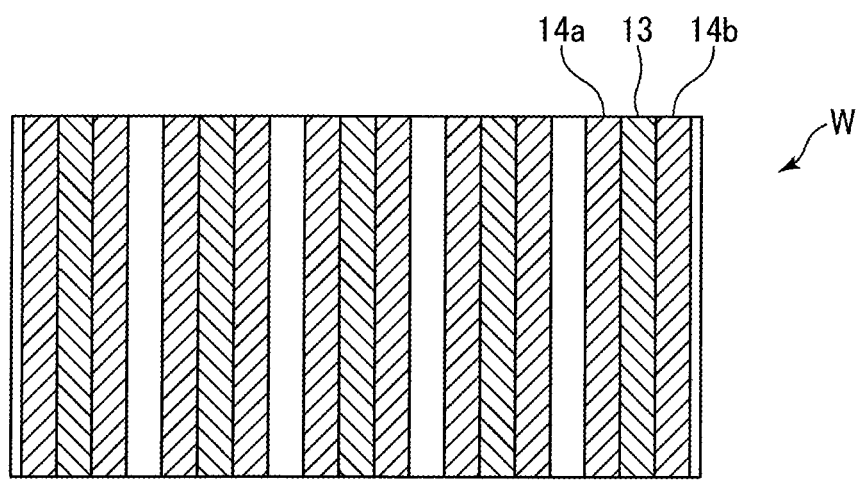
FIG. 3 is a plan view showing the structure of the substrate used in the pattern forming method according to the embodiment.

As shown in FIGS. 2 and 3, a semiconductor wafer, for example, is used as a substrate W. The substrate W is obtained by forming on a silicon base 10 a plurality of core materials 13 arranged in parallel in a line shape and in a convex shape and first and second line materials 14a and 14b arranged at one side and the other side of each of the core materials 13 in a line shape and in a convex shape, with an SiN film 11 and an $SiO_2$ film 12 as transfer layers interposed therebetween. The first and second line materials 14a and 14b form a convex line pattern. This line pattern is formed by, e.g., double patterning or quadruple patterning in which double patterning is performed twice in a lithographic process.

Accordingly, the line pattern can be formed as a fine pattern having a pitch of ½ or ¼ of a pitch that can be formed by a conventional lithography techniques. At this time, the core material 13 is processed such that the height of the core material 13 becomes higher than those of the first and second line materials 14a and 14b. The core material 13 is made of, e.g., Si. The first and second line materials 14a and 14b are made of, e.g., SiN.

Next, a mask material is selectively formed on the second line material 14b by performing a process including anisotropic film formation from the second line material 14b side (step ST2).

Next, the first line material 14a of a region A is etched and removed by performing a process including etching using a line mask having a line-shaped hole at a portion corresponding to region A where the line cutting of the first line material 14a is to be performed (step ST3).

Figure 4:
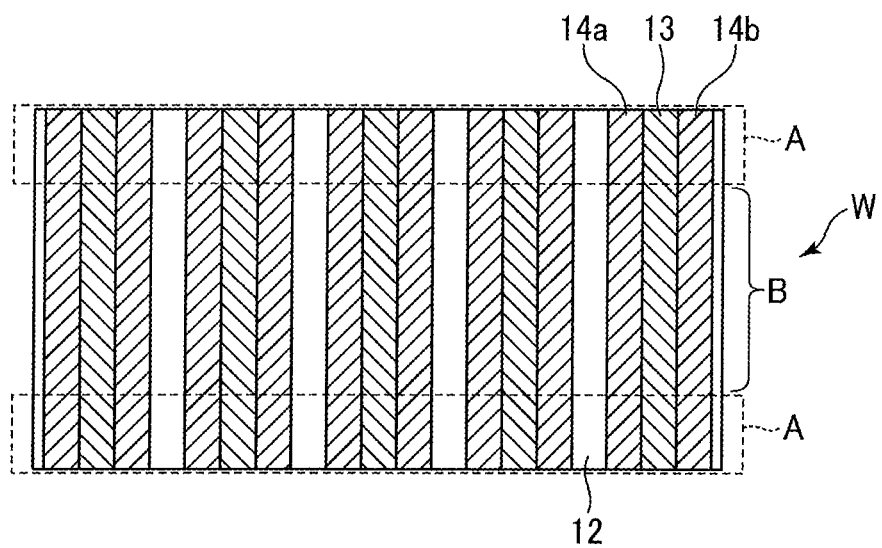
FIG. 4 is a plan view showing a region where line cutting is performed and a region where line cutting is not performed in the case of performing first-stage patterning on the substrate used in the pattern forming method according to the embodiment.

The first-stage patterning is performed by steps ST2 and ST3. In other words, in the first-stage patterning, among the line patterns of FIG. 3, the line cutting of the first line material 14a of the region A shown in FIG. 4 is performed by steps ST2 and ST3, and the first line material 14a in region B remains intact without being cut.

Figure 5:
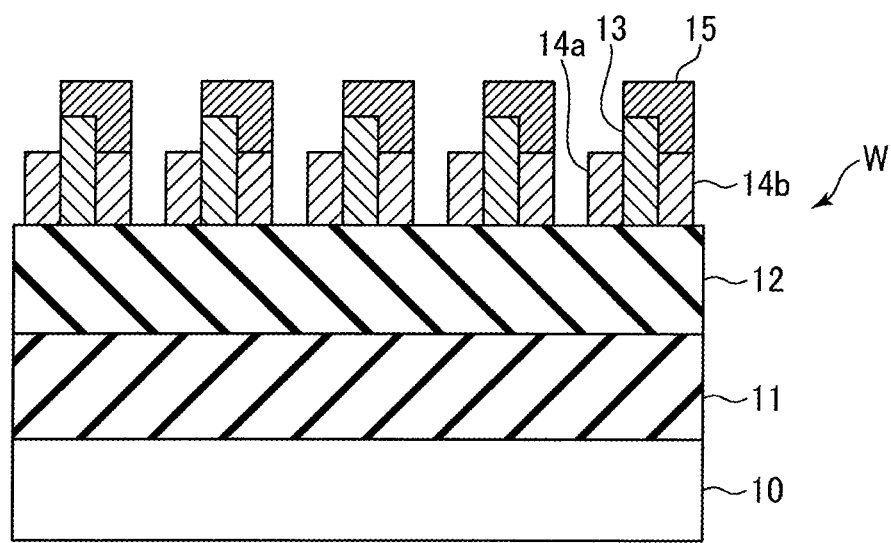
FIG. 5 is a cross-sectional view showing a state in which a mask material is selectively formed on a second line material and a core material by oblique film formation in the case of performing the first-stage patterning on the substrate used in the pattern forming method according to the embodiment.

In step ST2, oblique film formation in which film forming particles are supplied in an oblique direction with respect to the substrate W from the second line material 14b side is performed as an example of first anisotropic film formation. Accordingly, a mask material 15 is formed on the second line material 14b and the core material 13 as shown in FIG. 5. In the oblique film formation, a film forming material does not reach the first line material 14a, and the mask material 15 is selectively formed on the second line material 14b and the core material 13. A TiN film or an $SiO_2$ film is used as the mask material 15, for example.

Figure 6:
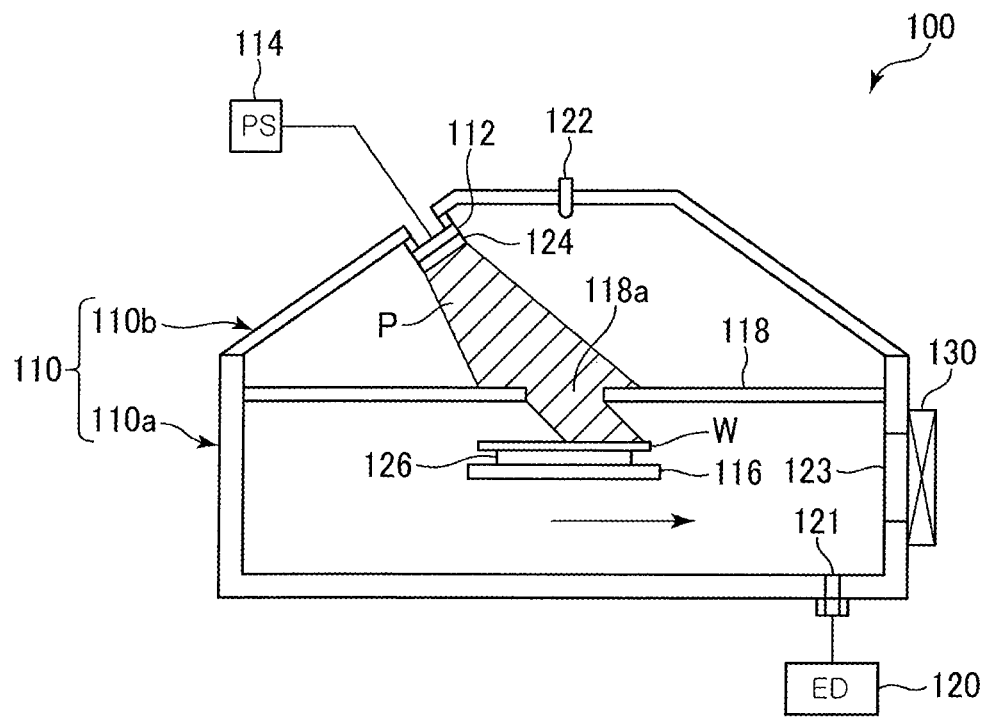
FIG. 6 is a schematic cross-sectional view showing an example of a film forming apparatus for performing the oblique film formation.

The oblique film formation can be performed by, e.g., a film forming apparatus shown in FIG. 6. A film forming apparatus 100 of FIG. 6 performs film formation by sputtering, and includes a chamber 110, a target 124, a power supply (PS) 114, a substrate moving unit 116, a sputtering particle shielding plate 118, an exhaust device (ED) 120, and a gas inlet port 122.

The chamber 110 has a cylindrical chamber main body 110a having an upper opening and a pointed conical lid 110b for covering the upper opening of the chamber main body 110a. The inside of the chamber 110 is divided into an upper space and a lower space by the sputter particle shielding plate 118. The upper space is a space where sputter particles are generated, and the lower space is a processing space where sputter film formation is performed on the substrate W. The sputter particle shielding plate 118 has a slit-shaped hole 118a through which sputter particles pass.

The gas inlet port 122 is disposed at the top of the lid 110b of the chamber 110, and an inert gas such as Ar gas or the like is introduced as a sputtering gas into the chamber 110 from the gas inlet port 122.

An exhaust port 121 is formed at a bottom portion of the chamber 110, and the exhaust device 120 is connected to the exhaust port 121. The exhaust device 120 includes a pressure control valve and a vacuum pump, and the inside of the chamber 110 is depressurized to a predetermined degree of vacuum by the exhaust device 120.

A loading/unloading port 123 for loading/unloading the substrate W is formed on a sidewall of the chamber 110. The loading/unloading port 123 is opened and closed by a gate valve 130.

A target holder 112 is disposed to be inclined on an inclined wall of the lid 110b of the chamber 110. Therefore, the target 124 is disposed to be inclined on the target holder 112. The target 124 is made of a material of the mask material 15 to be formed. The power supply 114 is connected to the target holder 112, and a gas introduced from the gas inlet port 122 is dissociated around the target 124 by applying a voltage from the power supply 114 to the target holder 112. Then, ions in the dissociated gas collide with the target 124, and sputter particles P that are particles of a constituent material of the target 124 are obliquely emitted from the target 124.

The substrate moving unit 116 is disposed in the space below the sputter particle shielding plate 118 of the chamber 110. The substrate moving unit 116 supports and moves the substrate W in one direction indicated by an arrow. In this example, the substrate moving unit 116 has support pins 126 for supporting the substrate W thereon. A conventional equipment such as a substrate transfer arm or a disc shutter may be used as the substrate moving unit 116.

In this film forming apparatus 100, the substrate W transferred from an adjacent transfer chamber by a transfer unit (all not shown) is delivered onto the substrate moving unit 116. Then, the inside of the chamber 110 is exhausted by the exhaust device 120, and an inert gas, for example, is introduced into the chamber 110 from the gas inlet port 122 to adjust a pressure therein to a predetermined pressure. The substrate moving unit 116 is moved in the direction indicated by the arrow, and a voltage is applied from the power supply 114 to the target holder 112. Accordingly, the sputter particles P are emitted from the target 124 and pass through the slit-shaped hole 118a obliquely at a predetermined angle, thereby forming a predetermined film on the substrate W.

Accordingly, it is possible to perform oblique film formation on the entire surface of the substrate W while maintaining incident angles of the sputter particles at a substantially constant angle.

Figure 7:
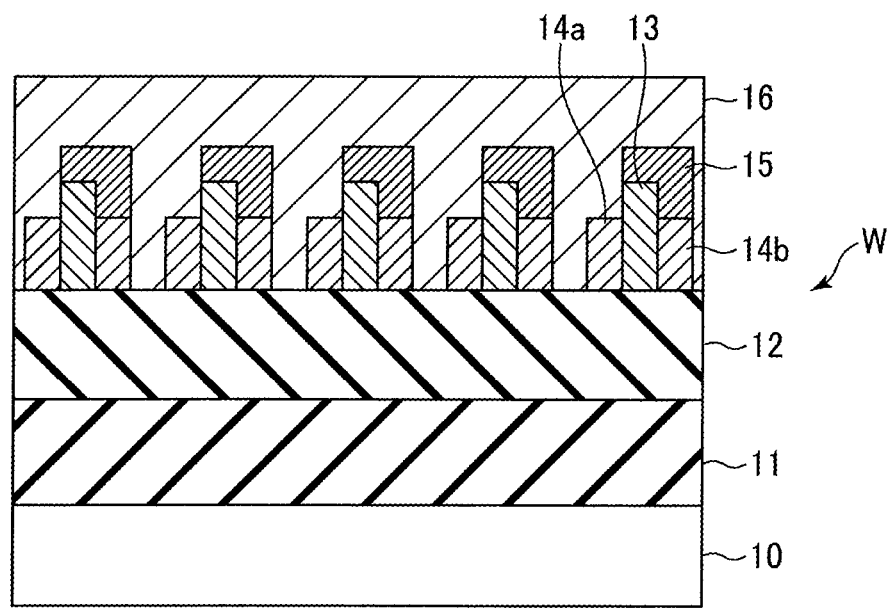
FIG. 7 is a cross-sectional view showing a state in which a filler is filled on the entire surface of the substrate of FIG. 5.
Figure 8:
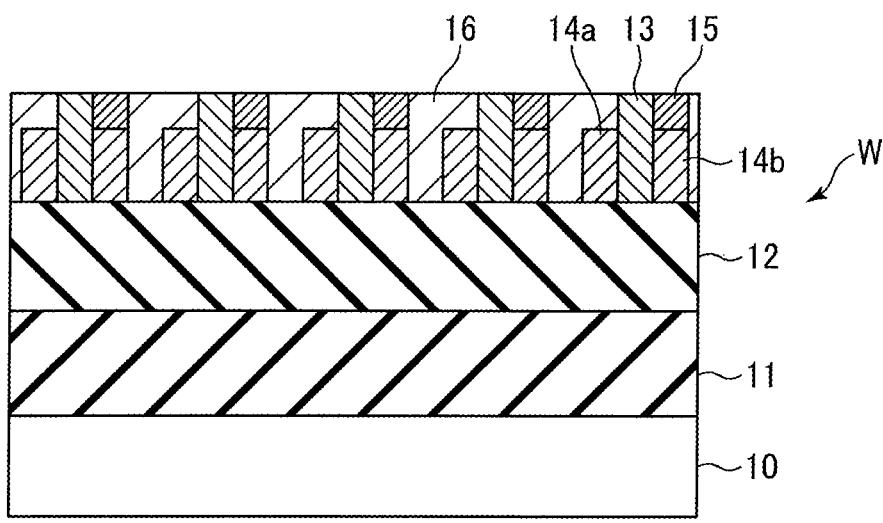
FIG. 8 is a cross-sectional view showing a state in which the mask material on the core material is removed by performing etchback or CMP on the entire surface from the state shown in FIG. 7.

In step ST2, after the mask material 15 is formed, a filler 16 made of spin-on carbon (SOC) is formed on the entire surface as shown in FIG. 7. Then, etchback or CMP is performed on the entire surface, so that the mask material 15 on the core material 13 is removed and the mask material 15 remains only on the second line material 14b as shown in FIG. 8.

Figure 9:
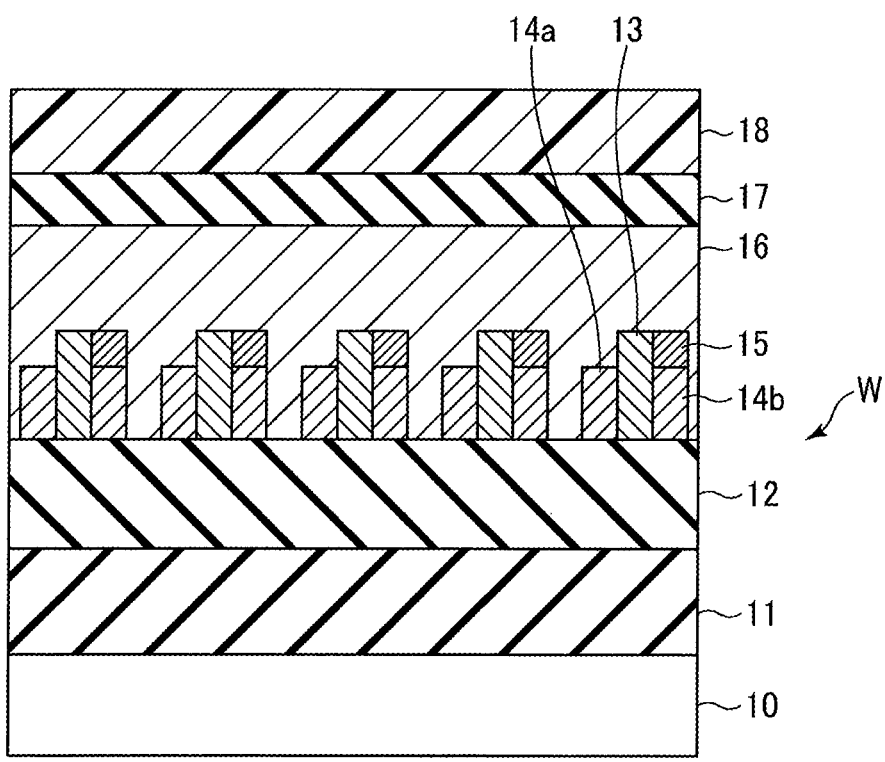
FIG. 9 is a cross-sectional view showing a state in which a filler is filled again from the state shown in FIG. 8 and an SOG layer and a resist layer are further formed.
Figure 10:
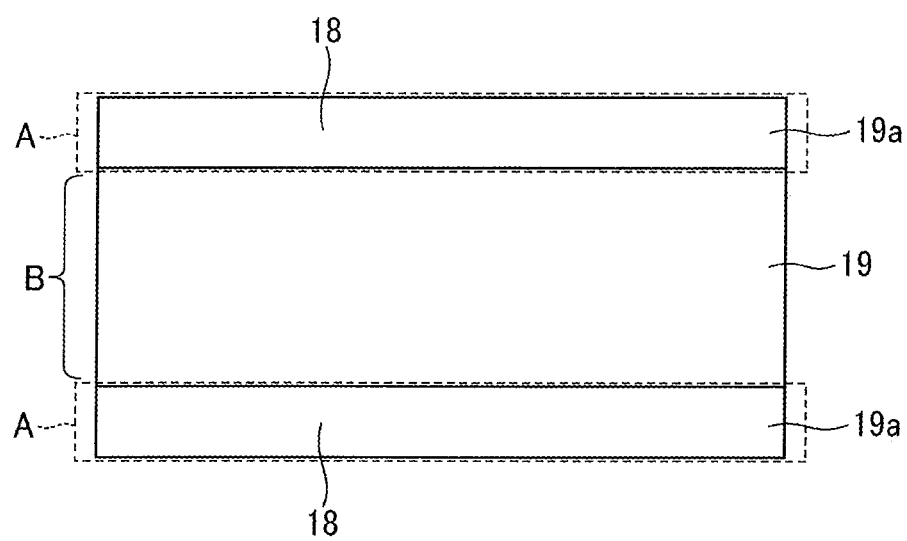
FIG. 10 is a plan view for explaining a line mask for performing line cutting of the substrate shown in FIG. 9.
Figure 11:
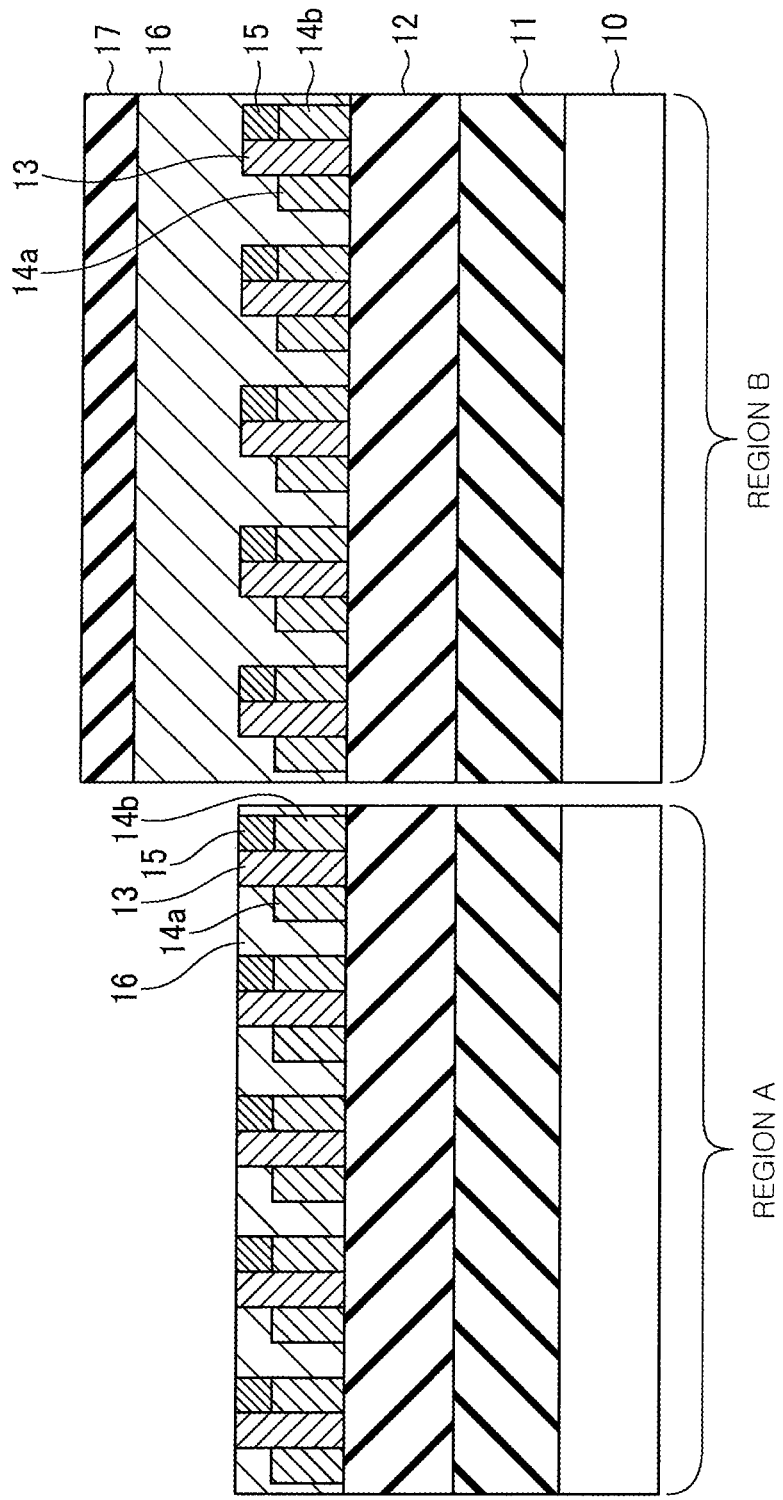
FIG. 11 is a cross-sectional view showing a state in which the filler and the SOG layer of the substrate of FIG. 9 are removed by etching using the resist layer as a mask.
Figure 12:
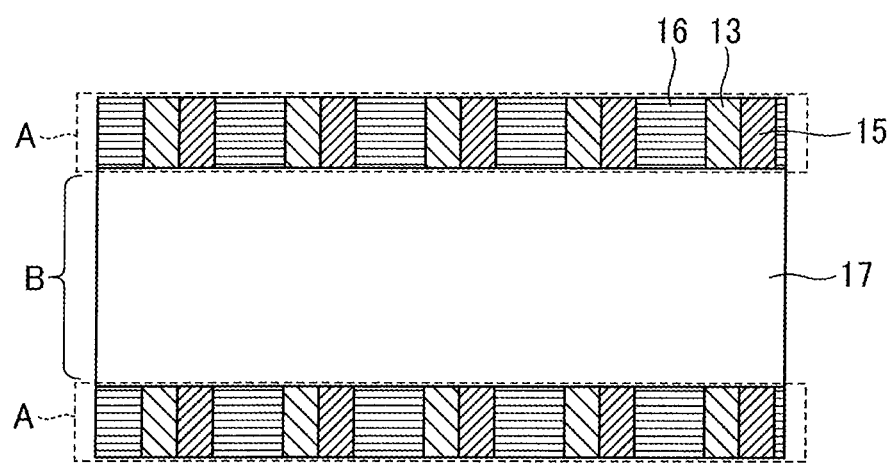
FIG. 12 is a plan view showing a state in which the filler and the SOG layer of the substrate of FIG. 9 are removed by etching using the resist layer as a mask.

In step ST3, as shown in FIG. 9, the filler 16 made of SOC is filled again, and a spin-on-glass (SOG) layer 17 as a first mask layer and a resist layer 18 as a second mask layer are further formed. Next, as shown in FIG. 10, a line mask 19 is disposed such that a hole 19a is located at a position corresponding to the region A (see FIG. 3), and the resist layer 18 of the region A is etched and removed. Then, the SOG layer 17 and the filler 16 made of SOC are removed by etching using the resist layer 18 in region B as a mask. Accordingly, the state shown in the cross-sectional view of FIG. 11 and the plan view of FIG. 12 is obtained. The etching at this time can be performed by plasma etching using, e.g., CF4, C4F8, O2, and Ar.

Figure 13:
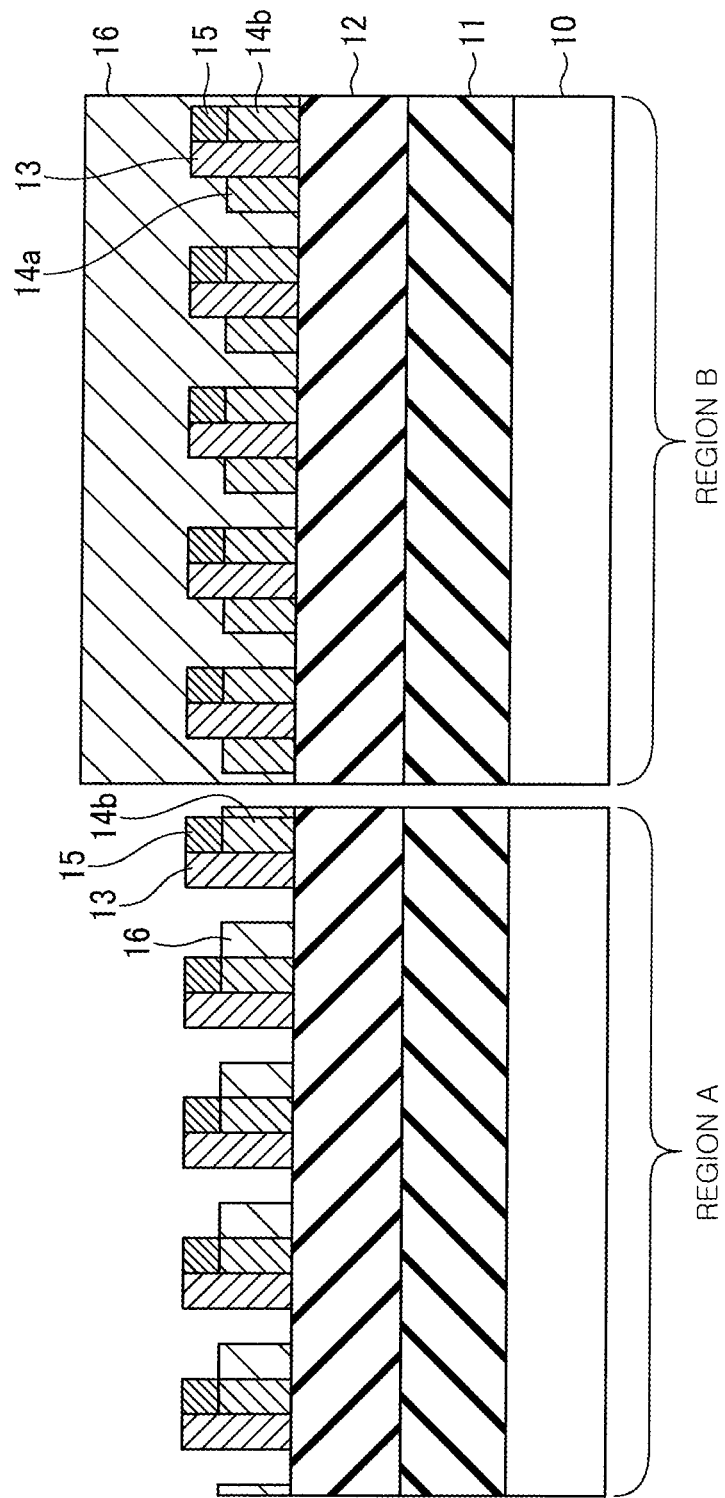
FIG. 13 is a cross-sectional view showing a state in which the SOG layer and the filler are etched in the substrates shown in FIGS. 11 and 12.
Figure 14:
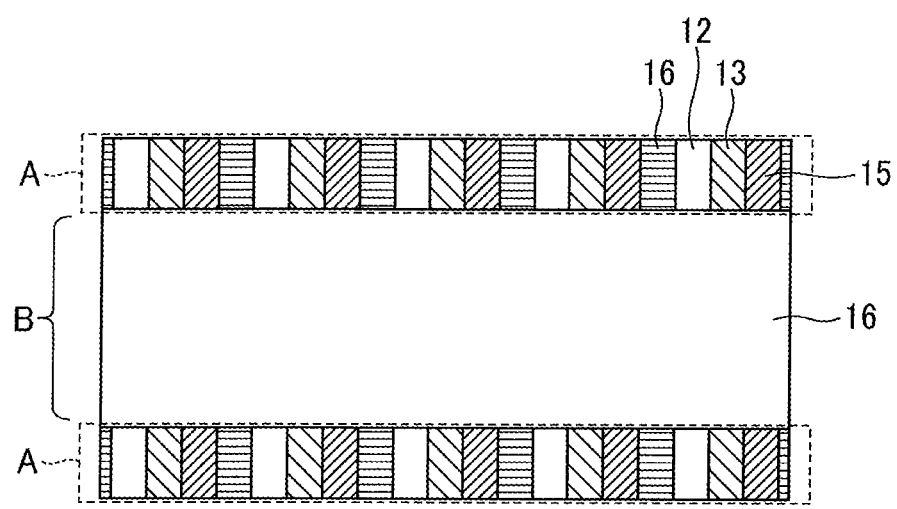
FIG. 14 is a plan view showing a state in which the SOG layer and the filler are etched in the substrate shown in FIGS. 11 and 12.

In step ST3, the SOG layer 17 in region B and the first line material 14a in region A are etched and removed by performing plasma etching using, e.g., CHF3, Ar, and H2, under the condition in which SiN as a constituent material of the first line material 14a is most easily etched. Accordingly, the state shown in the cross-sectional view of FIG. 13 and the plan view of FIG. 14 is obtained. The etching at this time can be performed by plasma etching using, e.g., CF4, C4F8, O2, and Ar.

Figure 15:
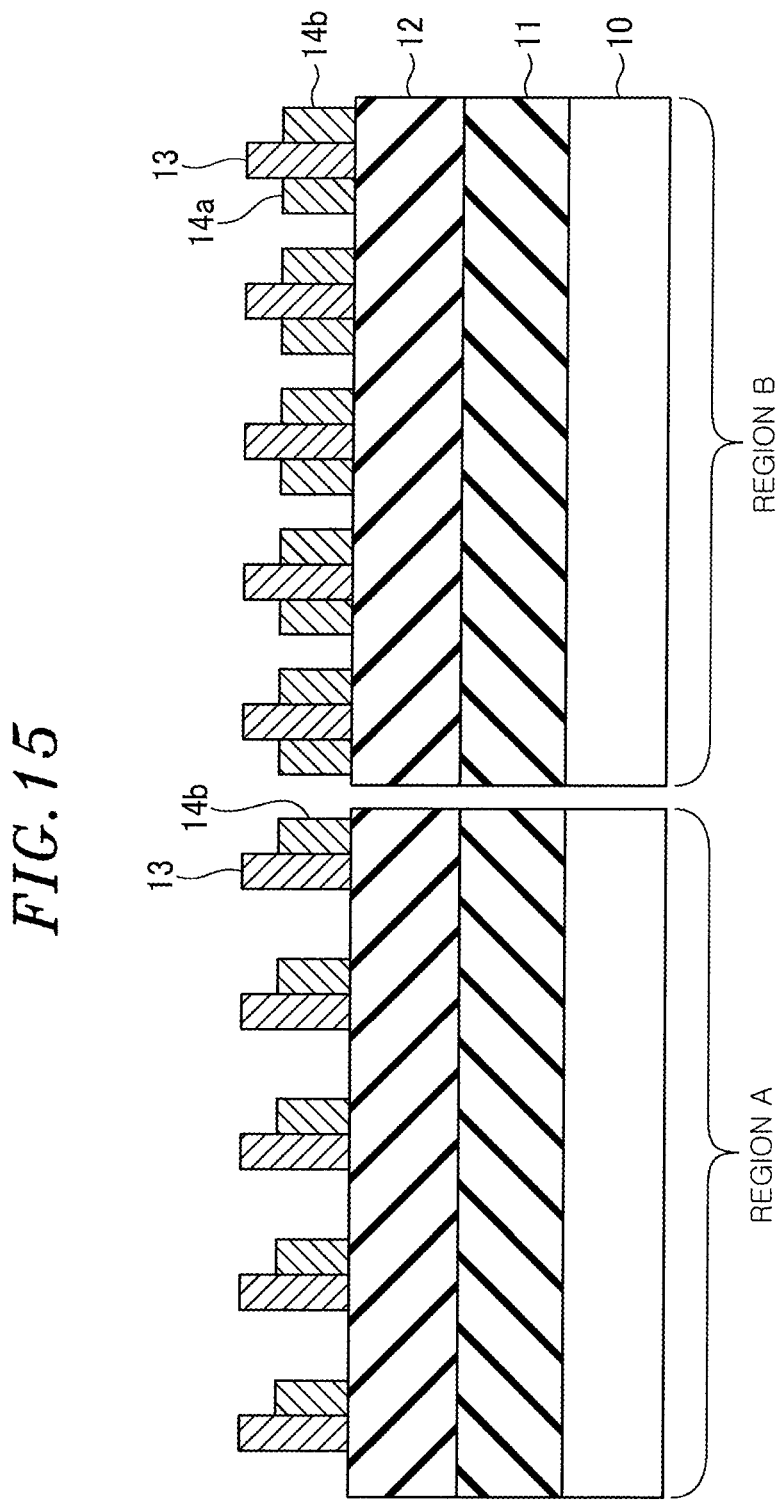
FIG. 15 is a cross-sectional view showing a state at the time of performing line cutting of a first line material of a region A in the substrate shown in FIGS. 13 and 14.
Figure 16:
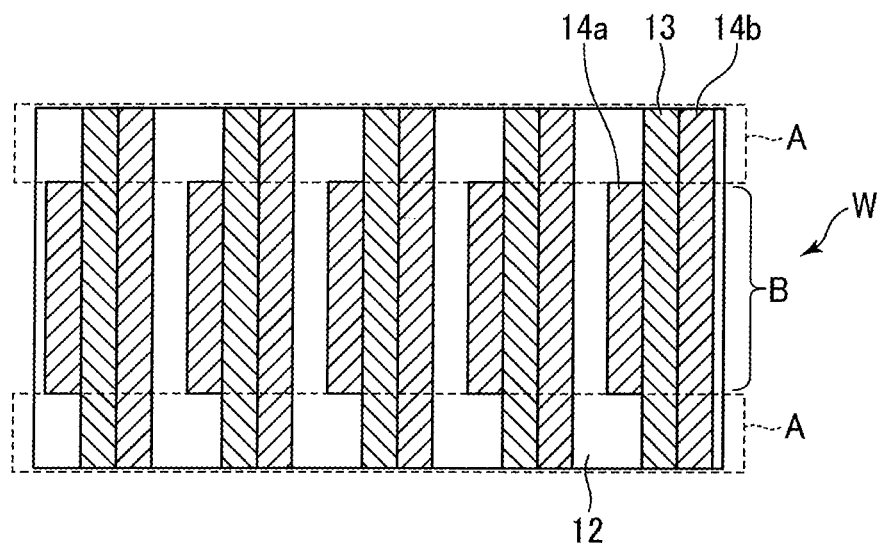
FIG. 16 is a plan view showing a state at the time of performing the line cutting of the first line material of the region A in the substrate shown in FIGS. 13 and 14.

In step ST3, the mask material 15 and the filler 16 made of SOC are etched and removed, thereby forming a pattern in which the first line material 14a of the region A is line-cut as shown in the cross-sectional view of FIG. 15 and the plan view of FIG. 16. The etching at the time can be performed by plasma etching using, e.g., Cl2 and N2, in the case where the mask material 15 is made of TiN.

Next, a mask material is selectively formed on the first line material 14a by performing a process including anisotropic film formation using oblique film formation from the first line material 14a side (step ST4).

Next, the second line material 14b of a region C is etched and removed by performing a process including etching using a line mask having a line-shaped hole in the region C where the line cutting of the second line material 14b is to be performed (step ST5).

Figure 17:
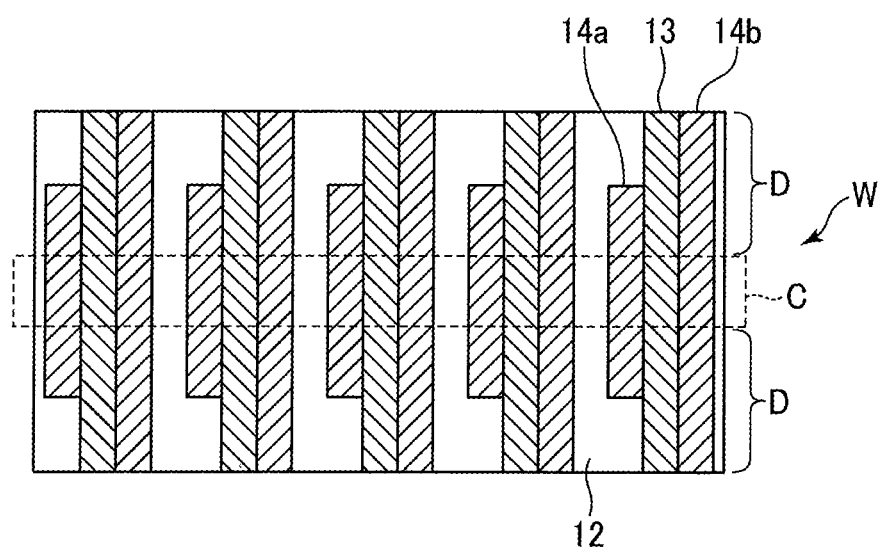
FIG. 17 is a plan view showing a state at the time of performing the line cutting of the first line material of the region A in the substrate shown in FIGS. 13 and 14.

By executing steps ST4 and ST5, second-stage patterning is performed on the substrate W (pattern) of FIG. 17 that has been subjected to the first-stage patterning. In other words, in the second-stage patterning, by executing step ST4 and step ST5, the line cutting of the second line material 14b of the region C shown in FIG. 17 is performed, and the line cutting of the second line material 14b in region D is not performed.

Figure 18:
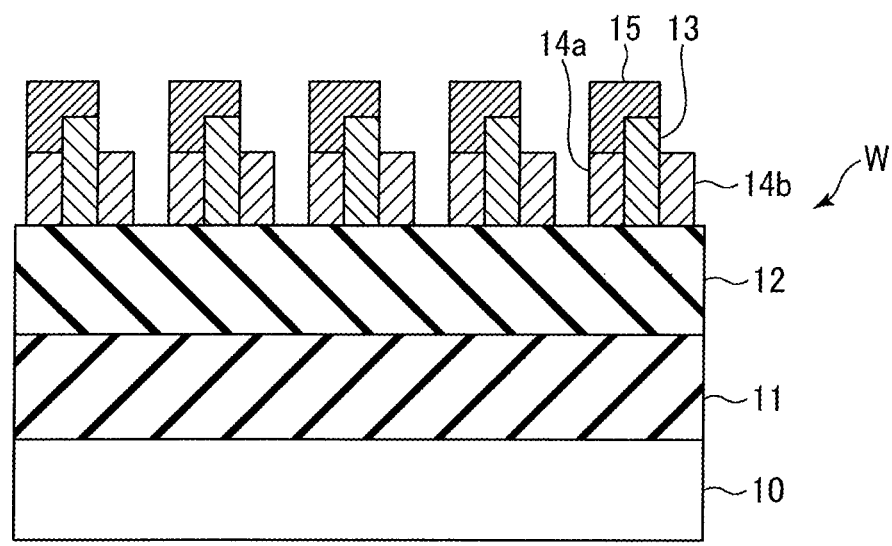
FIG. 18 is a cross-sectional view showing a state in which a mask material is selectively formed on the first line material and the core material by oblique film formation in the case of performing second-stage patterning on the substrate used in the pattern forming method according to the embodiment.

In step ST4, first, as shown in FIG. 18, the mask material 15 is formed on the first line material 14a and the core material 13 by the oblique film formation from the first line material 14a side opposite to that in the first-stage patterning. Then, the mask material 15 on the core material 13 is removed in the same sequence as that in the first-stage patterning, so that the mask material 15 remains on the second line material 14b.

Figure 19:
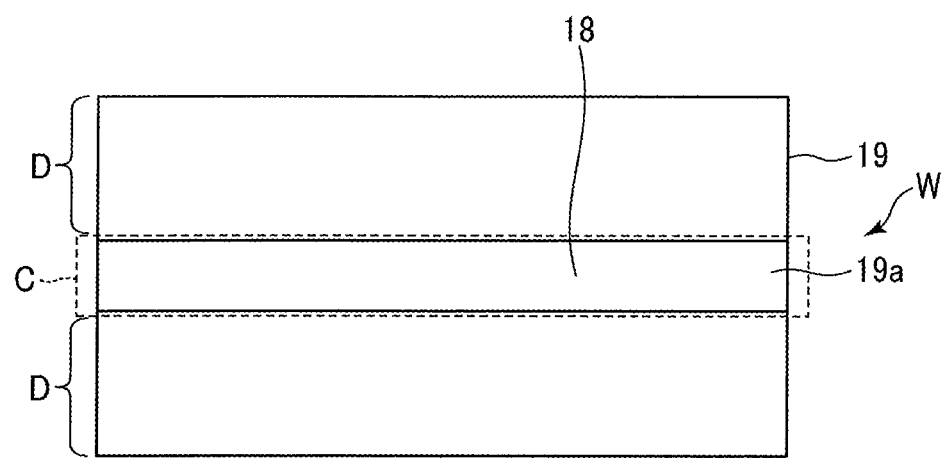
FIG. 19 is a plan view for explaining a line mask for performing line cutting on the substrate shown in FIG. 18.
Figure 20:
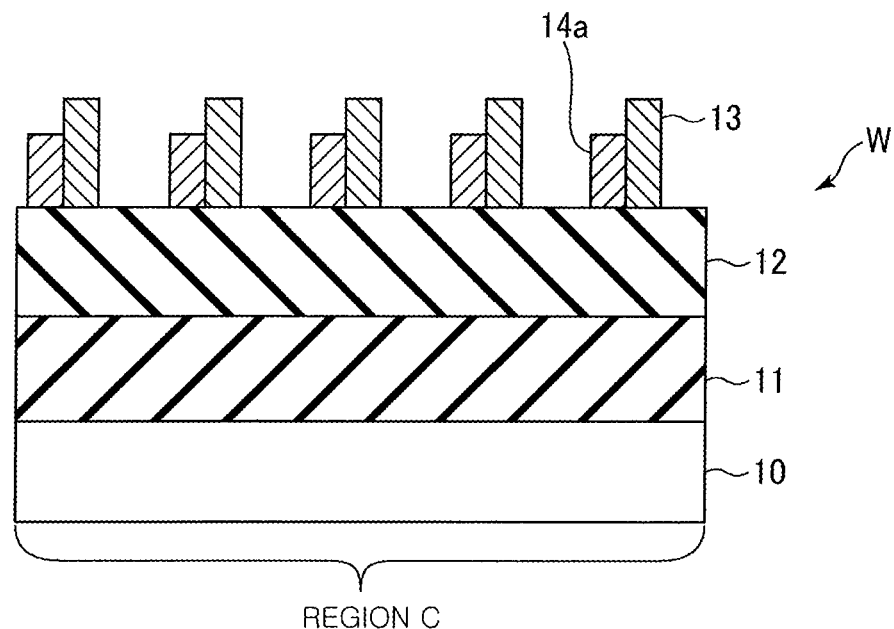
FIG. 20 is a cross-sectional view showing a state in which line cutting of a region C is performed using the line mask of FIG. 19 in the substrate shown in FIG. 18.
Figure 21:
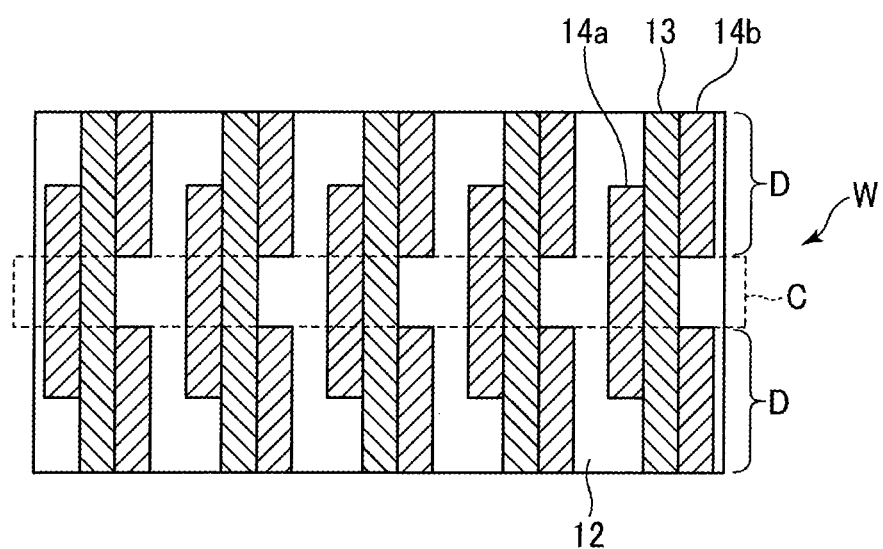
FIG. 21 is a plan view showing a state in which the line cutting of the region C is performed using the line mask of FIG. 19 in the substrate shown in FIG. 18.

In step ST5, the filler 16, the SOG layer 17, and the resist layer 18 are formed in the same sequence as that in the first-stage patterning. Then, as shown in FIG. 19, the line mask 19 is placed such that the position of the hole 19a corresponds to region C, and the resist layer 18 in region C is etched and removed. Then, as in the first-stage patterning, the SOG layer 17 of the region C and the filler 16 made of SOC are etched and removed using the resist layer 18 as a mask. Further, as in the first-stage patterning, the mask material 15 and the filling material 16 made of SOC are etched and removed, thereby forming a pattern in which the second line material 14b of the region C is line-cut as shown in the cross-sectional view of FIG. 20 and the plan view of FIG. 21.

Figure 22:
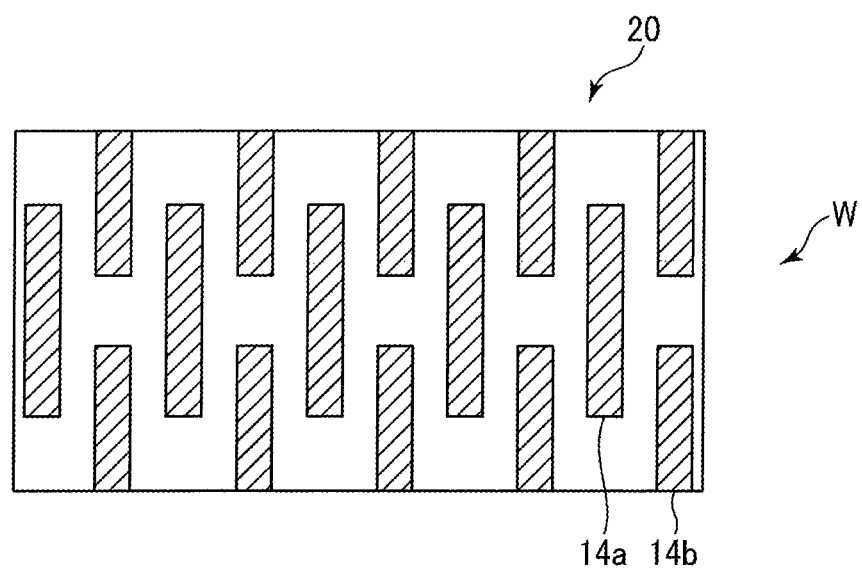
FIG. 22 is a plan view showing a state in which the core material of the substrate shown in FIG. 21 is removed to form an STI groove forming pattern.

Finally, the core material 13 is etched and removed (step ST6). Accordingly, an STI groove forming pattern 20 shown in FIG. 22 is formed. The etching at this time is performed by selective etching of Si by plasma etching using, e.g., HBr and Ar. Depending on the combination of materials, the core material 13 may be made of SiN. In that case, the core material 13 can be etched and removed by plasma etching using, e.g., CHF3, Ar, and H2.

Then, the pattern of FIG. 22 is sequentially transferred to the SiO$_2$ film 12 and the SiN film 11. Finally, the Si base 10 is etched to form an STI groove, and an appropriate material is embedded in the STI groove to form an STI.

Figure 23A:
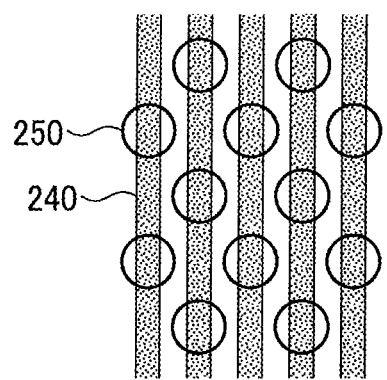
FIGS. 23A and 23B are plan views showing a conventional hole mask used for forming an STI groove forming pattern at a line-shaped pattern and the STI groove forming pattern formed by performing line cutting.
Figure 23B:
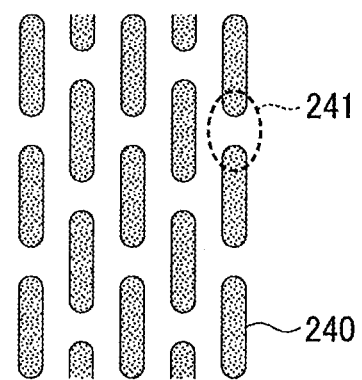
Figure 24:
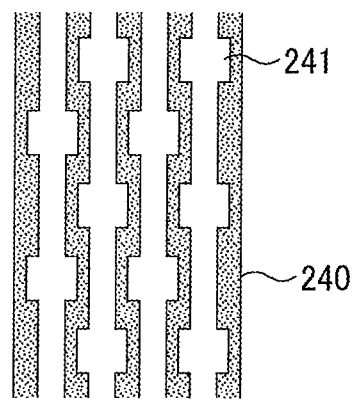
FIG. 24 is a plan view showing a state in which cut portions are displaced from the line material in the case of performing line cutting using the hole mask.

In the case of forming the STI groove forming pattern, conventionally, there is used a technique for performing line cutting of line materials 240 using a hole mask having holes 250 corresponding to positions where the line materials 240 are to be cut as shown in FIG. 23A. In other words, there is used a technique for forming the STI groove forming pattern by forming cut portions 241 at the line materials 240 as shown in FIG. 23B. However, as the miniaturization of the semiconductor device progresses, the dimensions of the lithography process become finer and the alignment margin becomes smaller. Accordingly, the holes 250 are likely to be displaced with respect to the line materials 240. Therefore, as shown in FIG. 24, the cut portions 241 are displaced from the line materials 240, which makes it difficult to form a pattern with high accuracy.

Therefore, in the present embodiment, a mask material is formed on only one line material by performing a process including anisotropic film formation and, then, a process including etching using a line mask having a line-shaped hole is performed. Accordingly, the line cutting of the line material can be performed in a self-aligned manner by a relatively simple process, and the line cutting can be performed to form a desired pattern without causing inaccuracy problems as in the conventional method and without complicating the processes.

While various embodiments have been described above, the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above-described embodiment, the case of forming the STI groove forming pattern has been described. However, the present disclosure is not limited thereto, and can be applied to any case of forming a pattern by cutting a line material. Further, although the case of cutting both of the first line material and the second line material has been described, the present disclosure can be also applied to the case of cutting only one of the first line material and the second line material.

Further, in the above-described embodiment, the example in which Si is used as the core material; SiN is used as the line material; and TiN or SiO$_2$ is used as the mask material has been described. However, the present disclosure is not limited thereto. For example, the core material, the first and second line materials, and the mask material may be appropriately selected from a group consisting of Si, Ti, Zr, Al, W, WC, WSi, Hf, SiC, C, Ta, an oxide thereof, and a nitride thereof. In particular, it is more effective to use the core material, the line material, and the mask material selected from a group consisting of SiO$_2$, SiN, Si, TiN, W, WSi, and WC. Further, it is preferable that the core material, the first and second line materials, and the mask material are different materials.

Further, in the above-described embodiment, the oblique film formation performed by sputtering is described as an example of the anisotropic film formation for forming the mask material. However, the present disclosure is not limited thereto, and the apparatus is also not limited to that shown in FIG. 6.

Further, although the case where the semiconductor wafer is used as the substrate has been described, the present disclosure is not limited thereto, and other substrates such as a flat panel display (FPD) substrate, a ceramic substrate, and the like may be used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pattern forming method for forming a pattern on a substrate, comprising:
    preparing a substrate on a base of which a plurality of core materials arranged in a convex shape and in a line shape, and first and second line materials arranged in a convex shape and in a line shape on one side and the other side of each of the core materials, respectively, are formed;
    selectively forming a mask material on any one of the first line material and the second line material by a process including anisotropic film formation;
    by a process including etching using a line mask having a line-shaped hole at a portion corresponding to a region where line cutting is performed, etching and removing the one on which the mask material is not formed among the first line material and the second line material in the region, the line-shaped hole of the line mask extending perpendicular to the direction in which the first and second line materials extend; and
    removing the core material,
    wherein said selectively forming the mask material on any one of the first line material and the second line material includes:
    forming the mask material on any one of the first line material and the second line material and the core material by the anisotropic film formation; and
    forming a filler on the entire surface and then removing the mask material on the core material by etchback or CMP so that the mask material remains on only one of the first line material and the second line material.

2. The pattern forming method of claim 1, wherein said etching the one on which the mask material is not formed among the first line material and the second line material includes:
    forming a filler, a first mask layer, and a second mask layer on the entire surface;
    etching and removing the second mask layer of the region where the line cutting is to be performed by etching using the line mask; and
    etching and removing the first mask layer, the filler, and any of the first line material and the second line material of the region where the line cutting is to be performed using the second mask layer as a mask.

3. The pattern forming method of claim 1, wherein the anisotropic film formation is oblique film formation in which film forming particles are supplied in an oblique direction with respect to the substrate.

4. The pattern forming method of claim 3, wherein the oblique film formation is sputtering in which sputter particles obliquely emitted from an inclined target are deposited on a moving substrate.

5. The pattern forming method of claim 1, wherein the core material, the first and second line materials, and the mask material are appropriately selected from a group consisting of Si, Ti, Zr, Al, W, WC, WSi, Hf, SiC, C, Ta, an oxide thereof, and a nitride thereof.

6. The pattern forming method of claim 5, wherein the core material, the first and second line materials, and the mask material are selected from a group consisting of SiO$_2$, SiN, Si, TiN, W, WSi, and WC.

7. The pattern forming method of claim 6, wherein the core material is made of Si, the first and second line materials are made of SiN, and the mask material is made of TiN or SiO$_2$.

8. The pattern forming method of claim 1, wherein the core material, the first line material, and the second line material are formed on the base with a transfer layer interposed therebetween.

9. The pattern forming method of claim 8, wherein an SiN film and an SiO$_2$ film are used as the transfer layer.

10. A pattern forming method for forming a pattern on a substrate, comprising:
    preparing a substrate on a base of which a plurality of core materials arranged in a convex shape and in a line shape, and first and second line materials arranged in a convex shape and in a line shape on one side and the other side of each of the core materials, respectively, are formed;
    selectively forming a mask material on the second line material by a process including anisotropic film formation;
    by a process including etching using a line mask having a line-shaped hole at a portion corresponding to a region where line cutting of the first line material is to be performed, etching and removing the first line material in that region;
    selectively forming a mask material on the first line material by a process including anisotropic film formation;
    by a process including etching using the line mask having a line-shaped hole at a portion corresponding to a region where line cutting of the second line material is to be performed, etching and removing the second line material in that region; and
    removing the core material,
    wherein the line-shaped holes of the line mask extend perpendicular to the direction in which the first and second line materials extend, and
    wherein said selectively forming the mask material on the second line material includes:
    forming the mask material on the second line material and the core material by the anisotropic film formation; and
    forming a filler on the entire surface and then removing the mask material on the core material by etchback or CMP so that the mask material remains only on the second line material.

11. The pattern forming method of claim 10, wherein an STI groove forming pattern is formed.

12. The pattern forming method of claim 10, wherein said etching and removing the first line material includes:
   forming a filler, a first mask layer, and a second mask layer on the entire surface;
   etching and removing the second mask layer in a region where line cutting of the first line material is to be performed by etching using the line mask; and
   etching and removing the first mask layer, the filler, and the first line material in the region where the line cutting of the first line material is to be performed using the second mask layer as a mask.

13. The pattern forming method of claim 10, wherein said selectively forming the mask material on the first line material includes:
   forming the mask material on the first line material and the core material by the anisotropic film formation; and
   forming a filler on the entire surface and then removing the mask material on the core material by etch back or CMP so that the mask material remains only on the first line material.

14. The pattern forming method of claim 10, wherein said etching and removing the second line material includes:
   forming a filler, a first mask layer, and a second mask layer on the entire surface,
   etching and removing the second mask layer in a region where line cutting of the second line material is to be performed by etching using the line mask; and
   etching and removing the first mask layer, the filler, and the second line material in the region where the line cutting of the second line material is to be performed using the second mask layer as a mask.

15. The pattern forming method of claim 10, wherein the anisotropic film formation is oblique film formation in which film forming particles are supplied in an oblique direction with respect to the substrate.

16. The pattern forming method of claim 10, wherein the core material, the first and second line materials, and the mask material are appropriately selected from a group consisting of Si, Ti, Zr, Al, W, WC, WSi, Hf, SiC, C, Ta, an oxide thereof, and a nitride thereof.

17. The pattern forming method of claim 10, wherein the core material, the first line material, and the second line material are formed on the base with a transfer layer interposed therebetween.

* * * * *